(12) United States Patent
Nishiura et al.

(10) Patent No.: US 7,658,313 B2
(45) Date of Patent: Feb. 9, 2010

(54) BALL FORMING DEVICE IN A BONDING APPARATUS AND BALL FORMING METHOD

(75) Inventors: Shinichi Nishiura, Fussa (JP); Fumio Miyano, Akiruno (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 166 days.

(21) Appl. No.: 11/704,093

(22) Filed: Feb. 8, 2007

(65) Prior Publication Data

US 2008/0000950 A1 Jan. 3, 2008

(30) Foreign Application Priority Data

Jul. 3, 2006 (JP) .............. 2006-182907

(51) Int. Cl.
- B23K 1/06 (2006.01)
- B23K 5/20 (2006.01)
- B23K 20/10 (2006.01)
- B23K 37/00 (2006.01)
- B23K 31/00 (2006.01)
- B23K 31/02 (2006.01)
- B23K 35/38 (2006.01)

(52) U.S. Cl. .................. 228/110.1; 228/4.5; 228/180.5; 228/219; 228/220

(58) Field of Classification Search .............. 228/110.1, 228/4.5, 180.5, 904, 219, 220
See application file for complete search history.

(56) References Cited

U.S. PATENT DOCUMENTS 6,234,376 B1 5/2001 Wicon

FOREIGN PATENT DOCUMENTS

| JP | 59-219935 | | 12/1984 |
|---|---|---|---|
| JP | 60-33440 (U) | | 3/1985 |
| JP | 04-28136 | | 5/1985 |
| JP | 60-211951 | | 10/1985 |
| JP | 60-213038 | | 10/1985 |
| JP | 60244034 A | * | 12/1985 |
| JP | 60-010249 | | 1/1986 |
| JP | 61-296731 | | 12/1986 |
| JP | 61296731 A | * | 12/1986 |
| JP | 62-62436 (U) | | 4/1987 |
| JP | 62-62438 (U) | | 4/1987 |

* cited by examiner

Primary Examiner—Jerry Lorengo
Assistant Examiner—Eli Mekhlin
(74) Attorney, Agent, or Firm—William L. Androlia; H. Henry Koda

(57) ABSTRACT

A ball forming device and method used in a bonding apparatus, including a bonding arm, a capillary attached to the bonding arm, an electronic flame off prove for forming a ball at the tip of a wire passing through the capillary, and a gas atmosphere forming unit for bringing the vicinity of the tip end of the wire into a gas atmosphere. The gas atmosphere forming unit is made of an inner wall element and an outer wall element with a hollow space section in between. The bonding arm side of the inner wall element has an inside open space which is wider than the portion of the bonding arm where the capillary is attached, and gas ejection ports are formed in the inner wall element. A gas supply pipe is connected to the outer wall element to supply, for instance, a reducing gas into the hollow space section.

6 Claims, 1 Drawing Sheet

BALL FORMING DEVICE IN A BONDING APPARATUS AND BALL FORMING METHOD

BACKGROUND OF THE INVENTION

The present invention relates to a ball forming device used in a bonding apparatus and to a ball forming method.

Gold wire is commonly used as a bonding wire (merely called, "wire") for connecting between a first bonding point and a second bonding point and for forming bumps. However, in order to reduce manufacturing costs, attempts have been made to use copper wires or aluminum wires. However, these wires cause oxidation to readily occur when forming a ball at a tip end of the wire. So as to prevent oxidations, various structures have been proposed, and Japanese Patent Application Examined Publication Disclosure No. H04 (1992)-28136 B, which is corresponding to Japanese Patent Application Unexamined Publication Disclosure S60 (1985)-244034 A, for example, discloses a ball forming device that prevents wire oxidation in a wire bonding apparatus.

In the ball forming device of Japanese Patent Application Examined Publication Disclosure No. H04 (1992)-28136 B, a cylindrical cover is provided so that it surrounds the capillary, and a reducing gas or inactive gas is supplied inside this cylindrical cover to bring the vicinity of a tip end of the wire passing through the capillary into a gas atmosphere. A ball is formed at the tip end of the wire by an electric discharge from an electronic flame off prove in this gas atmosphere.

In this ball forming device of Japanese Patent Application Examined Publication Disclosure No. H04 (1992)-28136, though not shown in its drawings, the upper part of the capillary is secured to a bonding arm, and the work to be bonded is pressed against a working platform by a pressing arm that moves up and down, vertically. For this reason, in view of the length (or height) of the capillary, the cylindrical cover needs to have a height that does not interfere with the pressing arm that moves up and down and the thickness of the bonding arm. Generally, the length of the capillary is 11.1 mm, the length by which the capillary is secured to the bonding arm is 4 mm, and the thickness and the distance of the up-and-down motion of the pressing arm is 4.7 mm; accordingly, the height of the cylindrical cover is as thin as approximately 2 mm or so. With such a very thin cylindrical cover, it is very difficult to form a gas atmosphere inside the cylindrical cover. Furthermore, the capillary moves up and down at high speed inside the cylindrical cover, and it also moves in the directions of X and Y axes (or horizontally); accordingly, with such a very thin cylindrical cover, the gas can easily escape. Therefore, in order to make the cylindrical cover long and form a sufficient gas atmosphere inside this cylindrical cover, it is necessary to make the length of the capillary substantially long; however this is difficult to accomplish because when the capillary has a substantial length, then the resonance point of the capillary brought by an ultrasonic wave oscillator tends to change so that smooth ultrasonic transmission is hindered.

BRIEF SUMMARY OF THE INVENTION

Accordingly, the object of the present invention is to provide a ball forming device used in a bonding apparatus and a ball forming method, in which the vicinity of a tip end of a bonding wire can be brought into a sufficient gas atmosphere without making the capillary substantially longer than it is actually necessary.

The above object is accomplished by a unique structure of the present invention for a bonding apparatus, particularly, for a ball forming device used therein, in which the ball forming device comprises: a bonding arm; a capillary attached to one end of the bonding arm; an electronic flame off probe for forming a ball at a tip end of a wire passing through the capillary; and a gas atmosphere forming device for providing in the bonding apparatus to bring a tip end part of the wire into a gas atmosphere; and in the present invention, the gas atmosphere forming device includes:

an inner wall element having a plurality of gas ejection ports, a bonding arm side of said inner wall element having an inside open space greater in width than a portion of the bonding arm where the capillary is attached to, an outer wall element secured to the inner wall element with a hollow space section in between, and a gas supply pipe for connecting to the outer wall element to supply a gas into the hollow space section.

As seen from the above, the inner wall element has a plurality of gas ejection ports, and a bonding arm side of said inner wall element having an inside open space is greater in width than a portion of the bonding arm where the capillary is attached to. Accordingly, the capillary can be moved up and down inside the gas atmosphere forming device or in its inside open space even if the length (or the vertical length or the height) of the gas atmosphere forming device is substantially great (or the gas atmosphere forming device is made large in its vertical direction). Because the up-and-down or vertical length (or height) of the gas atmosphere forming device can be made great in this manner in the present invention (or a capillary of any length can be used irrelevant to the size (vertical size) of the gas atmosphere forming device), the vicinity of the tip end of a wire can be maintained sufficiently in a gas atmosphere.

Furthermore, the above object is accomplished by unique steps of the present invention for a ball forming method using a bonding apparatus, and this method comprising the steps of:

providing a bonding apparatus that comprises;

a bonding arm, a capillary attached to one end of the bonding arm, an electronic flame off probe for forming a ball at a tip end of a wire passing through the capillary, and a gas atmosphere forming device for providing in the bonding apparatus to bring a tip end part of the wire into a gas atmosphere, the gas atmosphere forming device including an inner wall element having a plurality of gas ejection ports, a bonding arm side of said inner wall element having an inside open space greater in width than a portion of the bonding arm where the capillary is attached to, an outer wall element secured to the inner wall element with a hollow space section in between, and a gas supply pipe for connecting to the outer wall element to supply a gas into the hollow space section, supplying a gas from the gas supply pipe into the hollow space section;

ejecting the gas through the gas ejection ports into the inside open space;

maintaining the vicinity of the tip end part of the wire in the inside open space into a gas atmosphere; and forming the ball at the tip end of the wire by electrical discharge from the electronic flame off probe, after the tip end of the wire passing through the capillary being moved up and down so as to correspond to the electronic flame off probe.

DETAILED DESCRIPTION OF THE INVENTION

Figure 1A:
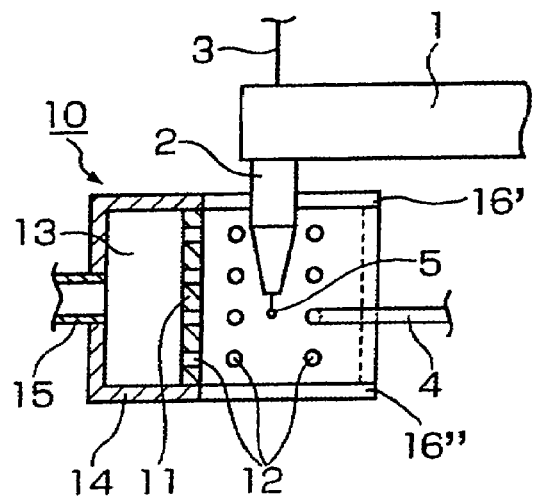
FIG. 1A shows, in vertical cross-section, a ball forming device according to one embodiment of the present invention used in a bonding apparatus.

One embodiment of the ball forming device used in a bonding apparatus, such as a wire bonding apparatus, of the present invention will be described with reference to FIGS. 1A through 1C and FIG. 2.

At one end of a bonding arm 1, a capillary 2 is secured with the other end of the capillary 2 being held on a bonding head (not shown) of a wire bonding apparatus; and a bonding wire ("wire") 3, which is a copper wire or an aluminum wire, passes through the capillary 2. At the tip end of the wire 3, a ball 5 is formed by electrical discharge produced by an electronic flame off prove 4. The electronic flame off prove 4 is secured to the bonding head, and this electronic flame off prove 4 is positioned so as to keep a predetermined distance, in a horizontal or XY direction, with respect to the capillary 2 and the tip end of the wire 3 passing the capillary 2.

A gas atmosphere forming device 10 that brings the vicinity of the tip end portion of the capillary 2, or the tip end of the wire projecting out of the tip end of the capillary 2, into a gas atmosphere is provided in an up-and-down driver (not shown) for the capillary 2. The gas atmosphere forming device 10 is secured either to a bonding head (not shown) that holds the bonding arm 1 in an up-and-down movable fashion or to an XY table that moves the bonding head in X and Y axes directions (or horizontally). In addition, an imaging device (camera) that takes images of a work is provided on the bonding head, and thus the gas atmosphere forming device 10 can be attached to a housing (not shown) that has the imaging device therein.

The gas atmosphere forming device 10 is comprised of an inner wall element 11 and an outer wall element 14. The bonding arm 1 side of the inner wall element 11 (or the portion of the inner wall element 11 that faces the capillary 2 or the bonding arm 1) extends up and down (vertically) for a predetermined length or height, and it is formed with an inside open space 10' that opens with a larger width than the width of the portion of the bonding arm 1 where the capillary 2 is attached to; and in addition, a plurality of gas ejection ports 12 are formed in this inner wall element 11. More specifically, the lateral (horizontal) cross-section of the inner wall element 11 is in the shape of a letter U or a letter C, and the inside open space 10' is located within this U- or C-shaped portion of the inner wall element 11.

On the outside of this inner wall element 11, the outer wall element 14, which, like the inner wall element 11, extends up and down (vertically) to have a predetermined height that is substantially the same as the height of the inner wall element 11, is secured, so that the inner wall element 11 and the outer wall element 14 form a hollow space section 13 in between. The upper edges of the inner and outer wall elements 11 and 14 are connected to each other with a top plate 16' and the bottom edges of the inner and outer wall elements 11 and 14 are connected to each other with a bottom plate 16'', so that the gas atmosphere forming device 10 is formed as an enclosed compartment with the inner wall element 11, outer wall element 14, top plate 16' and bottom plate 16'', having the hollow space section 13 therein.

To the outer wall element 14, a gas supply pipe 15 is connected so that a reducing gas or inactive gas is supplied into the hollow space section 13.

The above-described gas atmosphere forming device 10 is made of a resin material comprising an electrically insulating material.

The operation of the gas atmosphere forming device 10 will be described below.

Figure 1B:
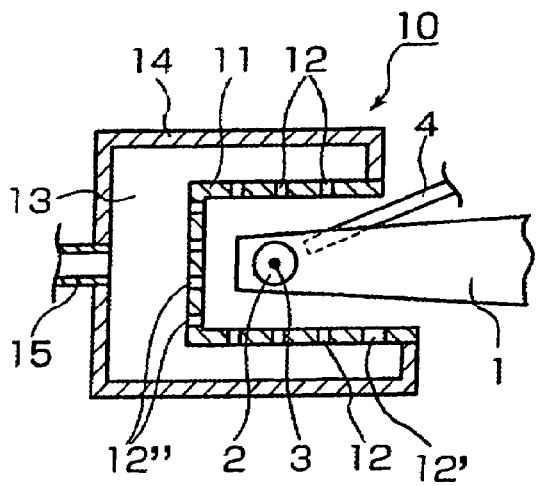
FIG. 1B is the ball forming device shown in lateral section.

In the condition diagrammed in FIGS. 1A and 1B, when, with the capillary 2, particularly the tip end of the wire 3 passing through the capillary 2, in the inside open space 10' of the inner wall element 11, a reducing gas or inactive gas is supplied from the gas supply pipe 15 into the hollow space section 13, this reducing gas or inactive gas is then ejected through the gas ejection ports 12 to the outside of the hollow space section 13 or into the inside open space 10'. As a result, the vicinity of the tip end part of the wire 3, which is in the inside open space 10', is brought into and maintained in a gas atmosphere. When the ball 5 is to be formed, after the tip end of the wire 3 passing through the capillary 2 is moved up and down so as to correspond with the electronic flame off prove 4, an electric discharge is produced by the electronic flame off prove 4, thus forming the ball 5 at the tip end of the wire 3. In this case, since the vicinity of the tip end part of the wire 3 is in a gas atmosphere of the reducing gas or inactive gas, oxidation of the ball 5 is prevented.

Figure 1C:
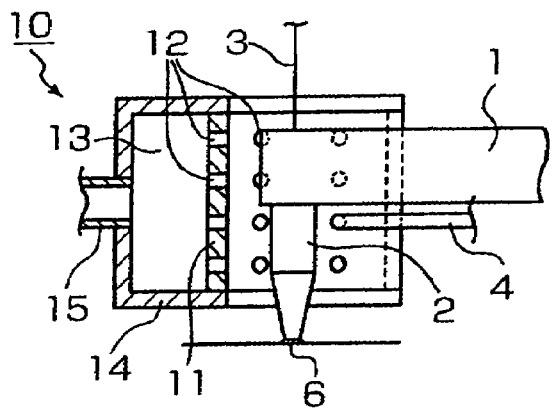
FIG. 1C is a vertical section thereof with the capillary descended.
Figure 2:
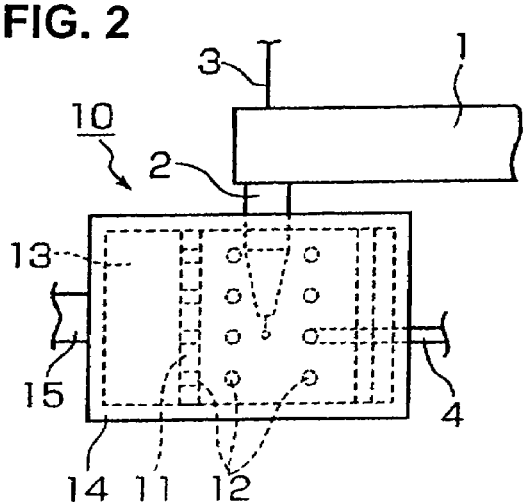
FIG. 2 is a front elevational view of the ball forming device of the present invention.

Next, as shown in FIG. 1C, the capillary 2 descends, and the ball 5 is bonded to a first bonding point 6. Then, the capillary 2 ascends and moves in the direction of a second bonding point (not shown), thus forming a wire loop (not shown), and then the wire 3 is connected to the second bonding point. During this operation, since the gas atmosphere forming device 10 is secured to the bonding head or to an XY table, it is moved in the direction of X and Y axes (or moved in the horizontal and vertical directions) together with the capillary 2.

Needless to say, the gas atmosphere forming device 10 can be used for bump forming processes in addition to the above-described wire bonding processes.

The inner wall element 11 of the gas atmosphere forming means 10 has such a structure that the bonding arm 1 side thereof is formed with the inside open space 10' which is greater in width than the portion of the bonding arm 1 where the capillary 2 is attached to. Accordingly, the capillary 2 can be moved up and down inside the gas atmosphere forming device 10 or in its inside open space 10' even if the up-and-down or vertical length of the gas atmosphere forming device 10 is substantially long. Since the up-and-down length or the height of the gas atmosphere forming device 10 can be made large in this manner, it is possible to maintain the vicinity of the tip end part of the wire 3 in a sufficient gas atmosphere. In other words, the gas atmosphere forming device 10 can take any vertical size irrelevant to the size (particularly, the length) of the capillary used with.

In the above structure, the gas ejection ports 12 are made in exactly the same size for all of them; however, they can be formed so that the gas ejection volume is greater on the open end side of the inner wall element 11 than on the deep end side. In other words, as seen from FIG. 1B, gas ejection port(s) 12', on the open end side, which is on the right side in FIG. 1B, can be formed greater in size (diameter, for instance) than the ejection port(s) 12'' on the deep end side, which is on the left side in FIG. 1B, so that the gas ejection volume is greater on the open end side than on the deep end side of the gas atmosphere forming device 10. With this structure, a gas curtain can be formed on the open end side area, and it will not be necessary to supply more reducing gas or inactive gas than necessary to the tip end part of the wire 3, which is preferable.

The invention claimed is:

1. A ball forming device in a bonding apparatus, said ball forming device comprising:
   a bonding arm;
   a capillary attached to one end of said bonding arm;
   an electronic flame off probe for forming a ball at a tip end of a wire passing through the capillary; and
   a gas atmosphere forming device for providing in said bonding apparatus to bring a tip end part of the wire into a gas atmosphere, said gas atmosphere forming device including
      an inner wall element having a plurality of gas ejection ports, a bonding arm side of said inner wall element having an inside open space greater in width than a portion of said bonding arm where said capillary is attached to;
      an outer wall element secured to said inner wall element with a hollow space section in between; and
      a gas supply pipe for connecting to said outer wall element to supply a gas into said hollow space section; and wherein
   said inner wall element is, in lateral cross-section, of a shape selected from a letter U and a letter C;
   said gas ejection ports provided in said inner wall element are formed so that a volume of gas ejection is greater at an open end side of said inside open space of said shape selected from said letter U and said letter C than at a deep end side thereof; and
   said gas is one selected from the group consisting of a reducing gas and an inactive gas.

2. The ball forming device according to claim 1, wherein a length of the capillary is substantially 11.1 mm, a length by which the capillary is secured to the bonding arm is substantially 4.0 mm and a thickness and a distance of an up and down motion of a pressing arm of said capillary is substantially 4.7 mm.

3. The ball forming device according to claim 1, wherein the lateral cross-section is in a horizontal plane.

4. A ball forming method using a bonding apparatus, said method comprising the steps of:
   providing said bonding apparatus comprising;
      a bonding arm,
      a capillary attached to one end of said bonding arm,
      an electronic flame off probe for forming a ball at a tip end of a wire passing through the capillary, and
      a gas atmosphere forming device for providing in said bonding apparatus to bring a tip end part of the wire into a gas atmosphere, said gas atmosphere forming device including
         an inner wall element having a plurality of gas ejection ports, a bonding arm side of said inner wall element having an inside open space greater in width than a portion of said bonding arm where said capillary is attached to,
         an outer wall element secured to said inner wall element with a hollow space section in between, and
         a gas supply pipe for connecting to said outer wall element to supply a gas into said hollow space section,
   supplying a gas from the gas supply pipe into the hollow space section;
   ejecting the gas through the gas ejection ports into the inside open space;
   maintaining the vicinity of the tip end part of the wire in the inside open space into a gas atmosphere; and
   forming the ball at the tip end of the wire by electrical discharge from the electronic flame off probe, after the tip end of the wire passing through the capillary being moved up and down so as to correspond to the electronic flame off probe; and wherein
   said inner wall element is, in lateral cross-section, of a shape selected from a letter U and a letter C;
   said gas ejection ports provided in said inner wall element are formed so that a volume of gas ejection is greater at an open end side of said inside open space of said shape selected from said letter U and said letter C than at a deep end side thereof; and
   said gas is one selected from the group consisting of a reducing gas and an inactive gas.

5. The ball forming device according to claim 4, wherein a length of the capillary is substantially 11.1 mm, a length by which the capillary is secured to the bonding arm is substantially 4.0 mm and a thickness and a distance of an up and down motion of a pressing arm of said capillary is substantially 4.7 mm.

6. The ball forming method according to claim 4, wherein the lateral cross-section is in a horizontal plane.

* * * * *